United States Patent
Sato

[11] Patent Number: 5,277,757
[45] Date of Patent: Jan. 11, 1994

[54] DRY ETCHING METHOD
[75] Inventor: Junichi Sato, Tokyo, Japan
[73] Assignee: Sony Corporation, Tokyo, Japan
[21] Appl. No.: 853,207
[22] Filed: Mar. 18, 1992
[30] Foreign Application Priority Data
  Mar. 18, 1991 [JP] Japan ................................... 3-77262
[51] Int. Cl.$^5$ ............................................. H01L 21/00
[52] U.S. Cl. ................................ 156/665; 156/643; 156/646; 156/652
[58] Field of Search ............... 156/643, 646, 665, 652

[56] References Cited

U.S. PATENT DOCUMENTS 4,030,967  6/1977  Ingrey et al. .................. 156/665
4,919,748  4/1990  Bredbenner et al. ........... 156/643

FOREIGN PATENT DOCUMENTS 02-284420  11/1990  Japan .

OTHER PUBLICATIONS

"Silicon Processing For The VLSI Era"; vol. 1; by Stanley Wolfe; © 1986; Lattice Press; Sunset Beach, Calif., pp. 559–563.

Primary Examiner—Brian E. Hearn
Assistant Examiner—George Goudreau
Attorney, Agent, or Firm—Hill, Steadman & Simpson

[57] ABSTRACT

Proposed is a dry etching method for etching a layer of an aluminum-based material, by means of which resist selectivity and underlying layer selectivity may be improved and maintenance of an etching apparatus may be facilitated. According to the present invention, the etching process is carried out in two steps, that is, a step of removing a native oxide film present on the surface of a layer of an aluminum-based material, using a reducing compound, such as $BCl_3$, $SiCl_4$ or $Si_2S_2Cl_4$ (tetrachlorocyclodisilthiane), and a subsequent step of etching the layer of the aluminum-based material using sulfur chloride such as $S_2Cl_2$. $BCl_3$ is reacted with residual oxygen in the apparatus to generate a large quantity of solid $B_2O_3$, so that problems were raised in the conventional process in connection with worsened maintenance. However, $BCl_3$ raises no problem with the present invention because it is used during only a short time period at the beginning of etching. Besides, since the reducing compound is not brought into contact with the underlying $SiO_2$ interlayer insulating film, underlying layer selectivity is improved. In addition, since sulfur (S) dissociated from sulfur chloride into a plasma is utilized for sidewall protection in the course of etching of the layer of the aluminum-based material, incident ion energies required for anisotropic etching may be diminished and resist selectivity may be improved.

2 Claims, 1 Drawing Sheet

DRY ETCHING METHOD

BACKGROUND OF THE INVENTION

1. Field of the Invention

This invention relates to a dry etching employed in the preparation of semiconductor devices. More particularly, it relates to etching of a layer of an aluminum (Al) based material in which resist selectivity and underlying layer selectivity may be improved and maintenance of an etching apparatus may be facilitated.

2. Description of the Related Art

As metallization materials for semiconductor devices, aluminum (Al), an Al-Si alloy containing 1 to 2 wt % of silicon (Si) and an Al-Si-Cu alloy further containing 0.5 to 1 wt % of Cu for combatting stress migration, are extensively employed.

Dry etching of the layer of the Al-based material is usually performed using chlorine based gases. Typical of these gases is a $BCl_3/Cl_2$ mixed gas as disclosed for example in JP Patent KOKOKU Publication 59-22374 (1984). Since chemical species contributing to the etching of the layer of the Al-based material as a main etchant are Cl* (Chlorine radicals), it inherently suffices to use only $Cl_2$. However, native oxides are present on the layer of the Al-based material and, unless these oxides are reduced, etching does not proceed promptly. Besides, etching proceeds isotropically with the use of only Cl*, contribution of ions in some form or other is required in order to effect anisotropic etching. $BCl_3$ is added in this consideration. That is, $BCl_3$ generate $BCl_x$, a chemical species exhibiting a strong reducing action, in a plasma, so that the native oxides on the surface of the Al-based material layer may thereby be reduced to cause the etching reaction to proceed smoothly. On the other hand, since ions derived from $BCl_3$, such as $BCl_x^+$, promote forward sputtering of the resist mask to deposit carbonaceous decomposition products on the pattern sidewall, anisotropic etching may also be achieved by the sidewall protection effect offered by these deposits.

However, the $BCl_3/Cl_2$ mixed gas suffers from the following problems.

The first problem is worsened maintenance. Since $BCl_3$ is reacted with oxygen during evacuation to produce boric acid ($B_2O_3$) which as white powders may possibly clog a piping of an evacuation system of the etching apparatus to prolong maintenance and to lower the throughput.

The second problem is that, since $BCl_3$ exhibits strong reducing properties, an underlying insulating film composed of e.g. silicon oxide, if exposed, is reduced, and hence is susceptible to etching by Cl*. This indicates significant deterioration in the underlying layer selectivity during overetching.

The third problem is that, while an ion incident energy needs to be increased to some extent in expectation of forward sputtering of the resist mask, resist selectivity is then naturally lowered, and that, if the underlying layer is exposed and sputtered by ions having such a large energy, the sputtered particles of insulating film are deposited on the pattern sidewall to form a re-deposited layer. This re-deposited layer is porous and hence ready to occlude residual chlorine to promote after-corrosion. Since it is the recent practice to provide a barrier metal layer below or to add Cu to the Al-based material layer, thus in a manner unfavorable from the standpoint of preventing the after-corrosion, formation of the re-deposited layer which can possibly provide a site for residual chlorine needs to be avoided to the utmost extent.

OBJECT AND SUMMARY OF THE INVENTION

As discussed above, most of the problems encountered in the conventional methods for etching the Al-based material layer are caused by the use of $BCl_3$. Thus it may be said to be undesirable to use an etching gas admixed with $BCl_3$ during the entire process of etching of the Al-based layer.

It is therefore an object of the present invention to provide a dry etching method which is free from the above mentioned problems and superior in resist and underlying layer selectivities and maintenance, and which enables anisotropic etching of the Al-based layer while effectively inhibiting the after-corrosion.

In the dry etching method of the present invention, reducing gases are used only in the step of removing native oxides present on the surface of the Al-based material layer, while sulfur chloride is used in the main step of etching the Al-based material layer.

The gases used in the step of removing the native oxides are $BCl_3$, $SiCl_4$, or compounds containing Si, S and halogen as constituent elements, referred to hereinafter as an SiSX compound, where X indicates halogen atoms.

$BCl_3$ exhibits reducing properties, as explained above. If $BCl_3$ is used, $B_2O_3$ is unavoidable provided in the evacuation system. However, since the native oxides may be removed in a far shorter time than is necessary for etching of the Al based material layer, the amount of $B_2O_3$ is far less than in the conventional methods in which $BCl_3$ is used throughout the entire process, so that the labor involved in or the frequency of maintenance operations may be reduced significantly.

On discharge decomposition, $SiCl_4$ yields $SiCl_x$, which is one of the highly reducing chemical species, in the plasma. SiSX compound can similarly produce $SiX_x$ as a chemical species exhibiting high reductivity. Since no solid substances are yielded by these gases in the evacuation system, it becomes possible to avoid such problems as may be produced with the use of $BCl_3$.

In the next step of etching of the Al-based material layer, sulfur chloride is employed. The present Assignee has been the first to apply for the dry etching employing sulfur chloride. If this gas is used for etching the Al-based material layer, Cl* radicals produced by discharge dissociation of sulfur chloride contribute as a main etchant. The etching reaction proceeds by a mechanism in which the reaction by Cl* is assisted by ions similarly produced by discharge dissociation, such as $S^+$, $SCl_x^+$ or $Cl_x^+$. The crucial point in this etching process is that sidewall protection may be achieved by sulfur deposition. That is, products of discharge dissociation of sulfur chloride may be utilized for sidewall protection, while decomposition products of the resist mask are not needed by the high anisotropic etching. Thus a dual advantage may be achieved, that is, the ion incident energies may be reduced, while anisotropic etching may become possible with a system in which supply of resist decomposition products can not be expected, as in the case of a three-layer resist process. Besides, since deposited sulfur may be easily sublimed off by heating the wafer to not less than about 90° C. after etching, the process is highly effective for preventing pollution by particles.

Meanwhile, sulfur chloride is similarly likely to be reacted with residual oxygen in the etching system during evacuation to yield sulfur oxide $SO_x$. Moreover, since $SO_x$ is a gas, in distinction from $B_2O_3$, and may be eliminated easily by provision of a desulfurizing unit, there is no risk of any complication in the apparatus maintenance.

Besides, according to the present invention, no reducing gases are contained in the etching gas employed in the etching process of the Al-based material layer. Therefore, if the Al-based material layer is overetched after a part of the underlying insulating layer is exposed, there is no risk of any reduction of the underlying insulating layer, so that the underlying layer selectivity may be improved. In addition, since anisotropic etching may be made under low bias conditions, not only resist selectivity is improved, but also there is no risk of re-deposition of the sputtered underlying insulating film on the pattern sidewall. This leads to significant improvement in the after-corrosion preventing effect.

Thus the present invention is highly effective in the preparation of semiconductor devices produced in accordance with extremely fine design rules to meet requirements for high performance, high integration and high reliability.

BRIEF DESCRIPTION OF THE DRAWINGS

FIG. 1a shows the state of a wafer prior to etching, FIG. 1b shows the state in which native oxides on the surface of the Al-1%Si layer are just removed, and FIG. 1c shows the state in which anisotropic etching of the Al-1%Si layer and the barrier metal is just completed.

DETAILED DESCRIPTION OF THE INVENTION

Figure 1A:
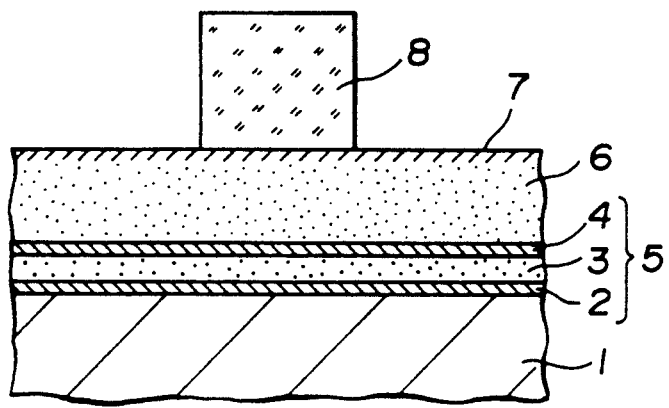
FIGS. 1a to 1c are schematic cross-sectional views showing an etching method of the present invention, step by step, where

Referring to the drawings, the present invention will be explained in detail with reference to non-limitative Examples.

EXAMPLE 1

In the present Example 1, an Al-based material layer and a barrier metal layer are etched, with the use of $S_2Cl_2$, after the native oxides on the surface of the Al-based material layer are removed with the use of $BCl_3$. The process is explained by referring to FIGS. 1a to 1c.

As shown in FIG. 1a, a wafer is provided, in which a first Ti layer 2, having a thickness of about 30 nm, a TiON layer 3, having a thickness of about 70 nm and a second Ti layer 4 having a thickness of about 30 nm are stacked in this order on an interlayer insulating film 1 formed of $SiO_2$ to produce a barrier metal layer 5. On this barrier metal layer 5, an Al-1%Si layer 6 is formed by sputtering to a thickness of about 300 nm and finally a resist pattern 8 is formed on the Al-1%Si layer 6. A native oxide film 7 formed essentially of $Al_2O_3$ is present on the surface of the Al-1%Si layer 6.

This wafer was set in a magnetically enhanced microwave plasma etcher and the native oxide film 7 was removed (by so-called breakthrough) under conditions of a $BCl_3$ flow rate of 100 SCCM, a gas pressure of 2.1 Pa (16 mTorr), a microwave power of 800 W and an RF bias power of 50 W (2 MHz). During this process, the native oxide layer 7 was quickly removed, under the reducing action of $BCl_3$, in a wafer region not masked by the resist pattern 8.

The etching conditions were changed to the $S_2Cl_2$ flow rate of 160 SCCM, a gas pressure of 2.1 Pa (16 mTorr), a microwave power of 800 W and an RF bias power of 30 W (2 MHz) for etching the Al-1%Si layer 6 and the barrier metal layer 5. Since $S_2Cl_2$ (melting point: $-80°$ C.) is liquid at ambient temperature, it was introduced into the etching system after vaporization by bubbling with He.

During the etching process, the etching reaction proceeded with Cl* dissociated from $S_2Cl_2$ by microwave discharge as a main etchant and the above two layers were removed in the forms of $AlCl_x$ and $TiCl_x$. Simultaneously, sulfur derived from $S_2Cl_2$ was deposited on the wafer pattern sidewall to form a sidewall protection film 9. As a result, an Al-1%Si pattern 6a and a barrier metal pattern 5a exhibiting satisfactory shape anisotropy were formed. In FIG. 1c, the layers after the patterning are indicated by numerals for the original layers with suffix letters a.

Overetching by about 50% was then performed. Since sidewall protection by sulfur is continued, no undercuts were formed in the barrier metal pattern 5a even although Cl* were in excess. Since etching was effected in a lower RF bias power region, the after-corrosion at an earlier time was suppressed without redeposition of the sputtered underlying interlayer insulating film 1 onto the pattern sidewall.

The sidewall protection film 9 could easily be sublimed off by heating the wafer to about 90° C. after the end of etching without causing pollution by particles.

In the present Example, $BCl_3$ is used only for a short time for removing the native oxide film 7, without being used throughout the entire etching process, as in the conventional methods, so that $B_2O_3$ was not precipitated in larger quantities into the evacuation system. Besides, since sulfur yielded from the gaseous phase could be used for sidewall protection in the course of etching of the Al-1%Si layer 6, optimum anisotropic etching could be achieved even under the above mentioned low bias and low incident ion energy conditions. This is favorable from the standpoint of preventing regression of the resist pattern 8 due to sputtering or generation of residues, and of improving underlying layer selectivity.

Although $S_2Cl_2$ was used in the present Example as a gas for etching the Al-1%Si layer 6, similar effects may be achieved by using other gases, such as sulfur chlorides $S_3Cl_2$ or $SCl_2$. Rare gases such as Ar or He may be added to the etching gas in expectation of sputtering, diluting or cooling effects.

EXAMPLE 2

In the present Example 2, the Al-1%Si layer and a barrier metal layer were etched, with the use of $S_2Cl_2$, after the native oxides on the surface of the Al-1%Si layer was removed with the use of $SiCl_4$. A wafer employed herein was the same as that used in Example 1.

This wafer was set in a magnetically enhanced microwave plasma etching device and the so-called breakthrough was effected under conditions of a $SiCl_4$ flow rate of 150 SCCM, a gas pressure of 2.1 Pa (16 mTorr), a microwave power of 800 W and an RF bias power of 50 W (2 MHz). During this process, $SiCl_x$, which is a strongly reducing chemical species, was yielded in the plasma by the microwave discharge, so that the native oxide film 7 was removed quickly.

The Al-1%Si layer 6 and the barrier metal layer 5 were etched, using $S_2Cl_2$ and the same operating conditions as those of Example 1. Etching proceeded while a sidewall protection film of sulfur 9 was formed simultaneously until an Al-1%Si pattern 6a and a barrier metal pattern 5a exhibiting satisfactory shape anisotropy as shown in FIG. 1c were produced.

EXAMPLE 3

In the present Example 3, after a native oxide film on the surface of an Al-1%Si layer was removed using $Si_2S_2Cl_4$ (tetrachlorocyclodisilthiane), an Al-1%Si layer and a barrier metal layer were etched using $S_2Cl_2$. A wafer used herein was the same as that used in Example 1.

This wafer was set in a magnetically enhanced microwave plasma etching device, and the so-called breakthrough was effected under conditions of a $Si_2S_2Cl_4$ flow rate of 150 SCCM, a gas pressure of 2.1 Pa (16 mTorr), a microwave power of 800 W and an RF bias power of 50 W (2 MHz). Meanwhile, $Si_2S_2Cl_4$ is a compound having the following chemical formula

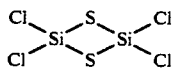 (1)

Since this compound is likely to be polymerized at higher temperatures, the temperature of the etching reaction system needs to be maintained at 180° C. or lower.

Figure 1B:
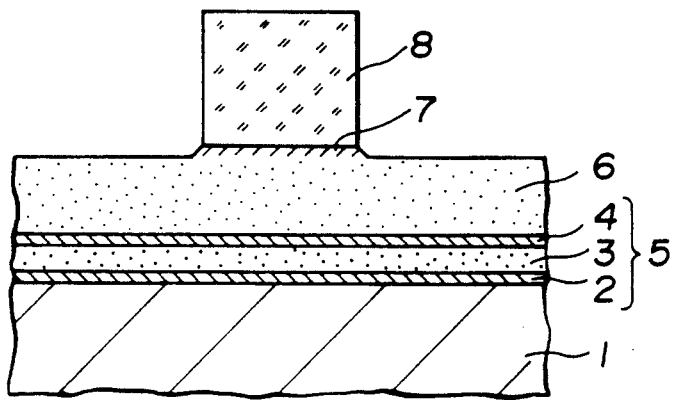
Figure 1C:
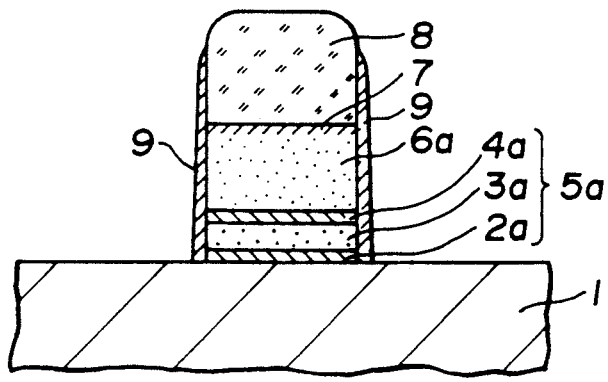

During the above mentioned etching process, $SiCl_x$, which is a strongly reducing chemical species, is produced in the plasma, so that the native oxide film 7 was eliminated promptly, as shown in FIG. 1b. Simultaneously, sulfur is produced in the gaseous phase due to discharge dissociation of $Si_2S_2Cl_4$. However, since sulfur is also a component producing the sidewall protection film 9 during the next etching process of etching the Al-1%Si layer 6, it raises no problem when deposited on the wafer or in the etching chamber.

Then, using $S_2Cl_2$, the Al-1%Si layer 6 and the barrier metal layer 5 were etched under the same conditions as those in Example 1. It was seen that etching proceeded as the sidewall protection film 9 of sulfur was deposited, until an Al-1%Si pattern 6a and a barrier metal pattern 5a having satisfactory shape anisotropy were formed, as shown in FIG. 1c.

Although $Si_2S_2Cl_4$ was used in the present Example as a gas for etching the native oxide film 7, $Si_2S_2F_4$ (tetrafluorocyclodisilthiane) shown by the formula

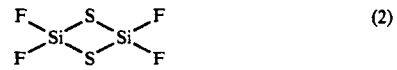 (2)

may also be employed as a compound containing Si, S and a halogen as constituent elements.

However, since this compound is decomposed on increasing the temperature, it is necessary to maintain the temperature of the etching reaction system so as to be 20° C. or lower when using this compound.

Besides, $SiSCl_2$ (silicon sulfide chloride) or $SiSBr_2$ (silicon sulfide bromide) may also be employed as such etching gas. However, since these compounds are solid at room temperature, they need to be dissolved in a suitable solvent and subsequently vaporized before being introduced into the etching system.

What is claimed is:

1. A dry etching method comprising the steps of removing a native oxide film on the surface of a layer of an aluminum-based material to form an exposed layer by using an etching gas containing at least one compound selected from the group consisting of $BCl_3$, $SiCl_4$ and a compound selected from a group consisting of $Si_2S_2Cl_4$, $Si_2S_2F_4$, $SiSCl_2$, and $SiSBr_2$, and then etching said exposed layer of the aluminum-based material by using an etching gas containing at least one sulfur chloride selected from the group consisting of $S_3Cl_2$, $S_2Cl_2$ and $SCl_2$.

2. A dry etching method comprising the steps of first removing a native oxide film on a surface of a layer of an aluminum-based material to form an exposed layer by using an etching gas containing at least one compound selected from a group consisting of $BCl_3$, $SiCl_4$ and a compound containing Si, S and a halogen as constituent elements, and then etching said exposed layer of aluminum material by using an etching gas free of $BCl_3$ and containing at least one sulfur chloride selected from a group consisting of $S_3Cl_2$, $S_2Cl_2$ and $SCl_2$.

* * * * *